(12) United States Patent
Lee et al.

(10) Patent No.: US 9,735,123 B2
(45) Date of Patent: Aug. 15, 2017

(54) SEMICONDUCTOR DEVICE STRUCTURE AND MANUFACTURING METHOD

(71) Applicant: Taiwan Semiconductor Manufacturing Co., Ltd, Hsin-Chu (TW)

(72) Inventors: Li-Guo Lee, Taipei (TW); Yi-Chen Liu, Zhubei, Hsinchu County (TW); Yung-Sheng Liu, Hsinchu (TW); Yi-Jen Lai, Hsinchu (TW); Chun-Jen Chen, Jhubei, Hsinchu County (TW); Hsi-Kuei Cheng, Zhubei, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 14/209,118

(22) Filed: Mar. 13, 2014

(65) Prior Publication Data

US 2015/0262953 A1    Sep. 17, 2015

(51) Int. Cl.
*H01L 23/48* (2006.01)
*H01L 23/00* (2006.01)
*H01L 23/31* (2006.01)

(52) U.S. Cl.
CPC .............. *H01L 24/13* (2013.01); *H01L 24/11* (2013.01); *H01L 23/3192* (2013.01);
(Continued)

(58) Field of Classification Search
CPC ... H01L 24/11; H01L 24/13; H01L 21/28247; H01L 23/28; H01L 23/564;
(Continued)

(56) References Cited

U.S. PATENT DOCUMENTS 3,740,831 A * 6/1973 Jordan ............... B23K 35/3615
148/23
6,028,357 A * 2/2000 Moriyama .............. H01L 23/24
257/737
(Continued)

FOREIGN PATENT DOCUMENTS

JP    2012069704    4/2012
KR    1020030067590    8/2003
(Continued)

OTHER PUBLICATIONS

Chinese language office action dated Mar. 21, 2016, issued in application No. TW 103145409.
(Continued)

*Primary Examiner* — Cheung Lee
*Assistant Examiner* — Stephen C Smith
(74) *Attorney, Agent, or Firm* — Slater Matsil, LLP

(57) ABSTRACT

A semiconductor device structure and a manufacturing method are provided. The method includes forming a conductive pillar over a semiconductor substrate. The method also includes forming a solder layer over the conductive pillar. The method further includes forming a water-soluble flux over the solder layer. In addition, the method includes reflowing the solder layer to form a solder bump over the conductive pillar and form a sidewall protection layer over a sidewall of the conductive pillar during the solder layer is reflowed.

20 Claims, 14 Drawing Sheets

(52) U.S. Cl.
CPC .............. *H01L 24/03* (2013.01); *H01L 24/05* (2013.01); *H01L 2224/0345* (2013.01); *H01L 2224/03912* (2013.01); *H01L 2224/0401* (2013.01); *H01L 2224/05008* (2013.01); *H01L 2224/05022* (2013.01); *H01L 2224/0558* (2013.01); *H01L 2224/05124* (2013.01); *H01L 2224/05147* (2013.01); *H01L 2224/05166* (2013.01); *H01L 2224/05181* (2013.01); *H01L 2224/05186* (2013.01); *H01L 2224/05573* (2013.01); *H01L 2224/05655* (2013.01); *H01L 2224/05666* (2013.01); *H01L 2224/119* (2013.01); *H01L 2224/1145* (2013.01); *H01L 2224/1147* (2013.01); *H01L 2224/11462* (2013.01); *H01L 2224/11821* (2013.01); *H01L 2224/11827* (2013.01); *H01L 2224/11848* (2013.01); *H01L 2224/11849* (2013.01); *H01L 2224/13006* (2013.01); *H01L 2224/13007* (2013.01); *H01L 2224/1357* (2013.01); *H01L 2224/13082* (2013.01); *H01L 2224/13083* (2013.01); *H01L 2224/13111* (2013.01); *H01L 2224/13147* (2013.01); *H01L 2224/13565* (2013.01); *H01L 2224/13693* (2013.01); *H01L 2924/13091* (2013.01)

(58) Field of Classification Search
CPC . H01L 2224/80355; H01L 2224/80375; H01L 2224/80395; H01L 2224/81375; H01L 2224/81355; H01L 2224/82355; H01L 2224/82375; H01L 2224/82395; H01L 2224/83355; H01L 2224/83375; H01L 2224/83395; H01L 24/03; H01L 24/05; H01L 23/3194; H01L 2224/0345; H01L 2224/03912; H01L 2224/0401; H01L 2224/05008; H01L 2224/05022; H01L 2224/05124; H01L 2224/05147; H01L 2224/05166; H01L 2224/05181; H01L 2224/05186; H01L 2224/0558; H01L 2224/05655; H01L 2224/05666
See application file for complete search history.

(56) References Cited

U.S. PATENT DOCUMENTS

| | | | |
|---|---|---|---|
| 6,050,481 A * | 4/2000 | Chapman | B23K 3/0623 228/180.22 |
| 8,970,034 B2 * | 3/2015 | Gandhi | H01L 23/3142 257/737 |
| 2003/0151140 A1 | 8/2003 | Nishiyama et al. | |
| 2004/0084510 A1 * | 5/2004 | Wetz | B23K 1/0016 228/207 |
| 2005/0090090 A1 * | 4/2005 | Kim | H01L 24/11 438/613 |
| 2009/0035893 A1 | 2/2009 | Nishiyama et al. | |
| 2009/0233436 A1 * | 9/2009 | Kim | H01L 24/11 438/614 |
| 2011/0062580 A1 * | 3/2011 | Liu | H01L 24/11 257/737 |
| 2011/0233761 A1 * | 9/2011 | Hwang | H01L 24/03 257/737 |
| 2011/0260317 A1 * | 10/2011 | Lu | H01L 24/11 257/737 |
| 2012/0068334 A1 | 3/2012 | Migita et al. | |
| 2012/0091577 A1 * | 4/2012 | Hwang | H01L 24/11 257/737 |
| 2012/0295434 A1 | 11/2012 | Cho et al. | |
| 2015/0228614 A1 * | 8/2015 | Interrante | H01L 24/81 438/107 |

FOREIGN PATENT DOCUMENTS

| | | |
|---|---|---|
| KR | 100585104 | 5/2006 |
| KR | 1020140026127 A | 3/2014 |

OTHER PUBLICATIONS

Korean language office action dated May 17, 2016, issued in application No. KR 10-2014-0191882.
English language translation of Korean office action.

\* cited by examiner

SEMICONDUCTOR DEVICE STRUCTURE AND MANUFACTURING METHOD

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures that utilize less area or smaller heights are being developed to package the semiconductor devices. Conductive bumps such as conductive pillars are used to establish electrical contact between a chip's I/O pads and a substrate of the lead frame of the package.

New packaging technologies have been developed to improve the density and functions of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
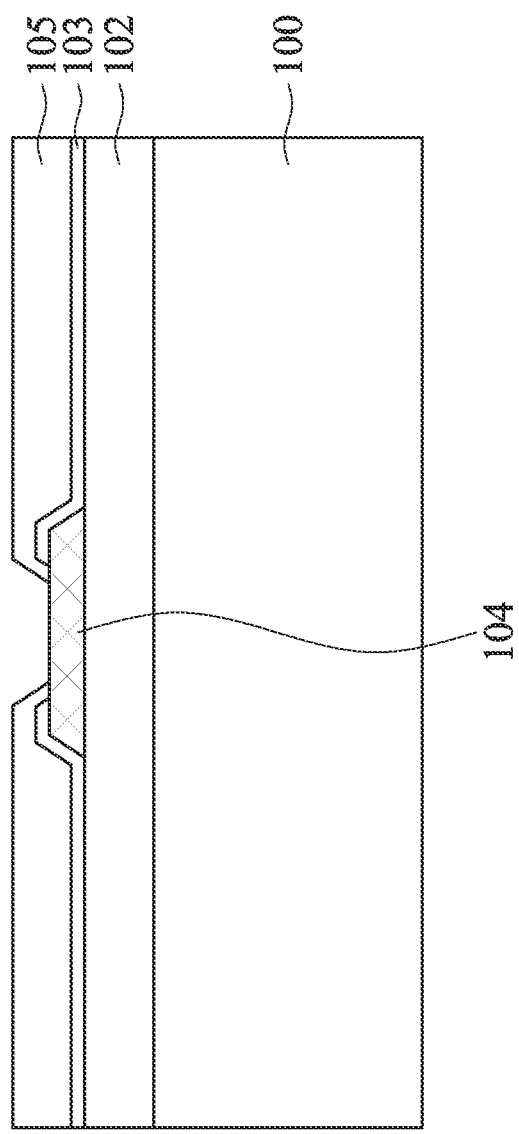
FIGS. 1A-1H are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1H are cross-sectional views of various stages of a process for forming a semiconductor device structure, in accordance with some embodiments. Referring to FIG. 1A, a semiconductor substrate 100 is provided. In some embodiments, the semiconductor substrate 100 is defined to mean a construction comprising one or more semiconductor materials. In some embodiments, the semiconductor substrate 100 includes a semiconductor wafer (such as a silicon wafer), or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

In some embodiments, the semiconductor substrate 100 includes isolation features (not shown). The isolation features may define and isolate various device elements (not shown) formed in the semiconductor substrate 100. The isolation features include shallow trench isolation (STI) features, local oxidation of silicon (LOCOS) features, other suitable isolation features, or a combination thereof.

Examples of the various device elements, which may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, other applicable elements, or a combination thereof.

Various processes are performed to form the various device elements, which include, for example, deposition, photolithography, etching, implantation, annealing, planarization, and/or other suitable processes. In some embodiments, the various device elements are interconnected to form an integrated circuit device. The integrated circuit device includes, for example, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

As shown in FIG. 1A, a dielectric layer 102 is formed over the semiconductor substrate 100, in accordance with some embodiments. In some embodiments, the dielectric layer 102 is a stack of multiple dielectric layers. In some embodiments, various conductive features are formed in the dielectric layer 102. The conductive features include, for example, multiple horizontal interconnects, such as conductive lines, and multiple vertical interconnects, such as conductive vias or conductive contacts. The conductive features formed in the dielectric layer 102 form conductive paths between the device elements (not shown) formed in or on the semiconductor substrate 100 and conductive traces over the dielectric layer 102. The device element may be a doped region formed in or over the semiconductor substrate 100. Alternatively, the device element may be a gate electrode formed over or in the semiconductor substrate 100. Multiple conductive lines and conductive vias or contacts (not shown) may be formed in the dielectric layer to form electrical connections to the device elements. The dielectric layer 102 and the conductive features may together form an interconnect structure over the semiconductor substrate 100.

In some embodiments, the dielectric layer 102 is made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. The low-k dielectric material may have a dielectric constant (k value) less than about 3.9 or less than about 2.8. In some embodiments, the conductive features formed in the dielectric layer 102 are made of copper, aluminum, tungsten, titanium, nickel, gold, platinum, other suitable material, or a combination thereof. A number of deposition, photolithography, and etching processes may be performed to form the dielectric layer 102 and the conductive features therein.

As shown in FIG. 1A, a conductive feature 104 is formed over the dielectric layer 102 over the semiconductor substrate 100, in accordance with some embodiments. In some embodiments, the conductive feature 104 is a top metallization layer formed in or on a top-level interlayer dielectric layer. In some embodiments, the conductive feature 104 includes a conductive trace region and a conductive pad region which are electrically connected with each other. The conductive feature 104 may also be referred to as a redistribution layer. In some embodiments, the conductive pad region is a region or an end of the redistribution layer. In some embodiments, the conductive feature 104 is electrically connected to one of the device elements in the semiconductor substrate 100 through some of the conductive lines and conductive vias formed in the dielectric layer 102. FIG. 1A shows a cross-sectional view of the conductive pad region of the conductive feature 104 in some embodiments. FIG. 1A shows a cross-sectional view of the conductive trace region of the conductive feature 104 in some other embodiments.

In some embodiments, the conductive feature 104 is made of AlCu, Al, Cu, other suitable materials, or a combination thereof. In some embodiments, the conductive feature 104 is formed by patterning a conductive layer deposited over the dielectric layer 102. For example, the conductive layer is patterned using a photolithography process and an etching process to form multiple conductive features including the conductive feature 104.

As shown in FIG. 1A, a passivation layer 103 is deposited and patterned over the dielectric layer 102 and the conductive feature 104, in accordance with some embodiments. The passivation layer 103 is patterned to have an opening which exposes a portion of the conductive feature 104. The opening allows a subsequent bump formation. In some embodiments, the passivation layer 103 is made of a non-conductive material. The non-conductive material may include silicon nitride, silicon oxynitride, silicon oxide, undoped silicate glass (USG), other suitable materials, or a combination thereof. In some embodiments, a passivation material layer is deposited using a chemical vapor deposition (CVD) process, a spin-on process, a physical vapor deposition (PVD) process, other applicable processes, or a combination thereof. Afterwards, a photolithography process and an etching process are performed to complete the formation of the passivation layer 103. Embodiments of the disclosure have many variations. In some embodiments, the passivation layer 103 is not formed.

As shown in FIG. 1A, a protection layer 105 is deposited and patterned over the passivation layer 103 and the conductive feature 104, in accordance with some embodiments. The protection layer 105 is patterned to have an opening which exposes a portion of the conductive feature 104, allowing the subsequent bump formation. In some embodiments, the opening of the protection layer 105 is smaller than that of the passivation layer 103, as shown in FIG. 1A. The opening of the protection layer 105 is positioned within the opening of the passivation layer 103. In some other embodiments, the opening of the protection layer 105 is greater than or substantially equal to that of the passivation layer 103.

In some embodiments, the protection layer 105 is relatively soft, and hence has the function of reducing inherent stresses. In some embodiments, the protection layer 105 is made of an organic material. The organic material may include polybenzoxazole (PBO), polyimide (PI), epoxy, benzocyclobutene (BCB), other suitable materials, or a combination thereof. Embodiments of the disclosure are not limited thereto. Other relatively soft organic or dielectric materials may be used for forming the protection layer 105. In some embodiments, a protection material layer is deposited using a spin-on process, a CVD process, a PVD process, other applicable processes, or a combination thereof. Afterwards, the protection material layer is patterned to form the protection layer 105. Embodiments of the disclosure have many variations. In some embodiments, the protection layer 105 is not formed.

Figure 1B:
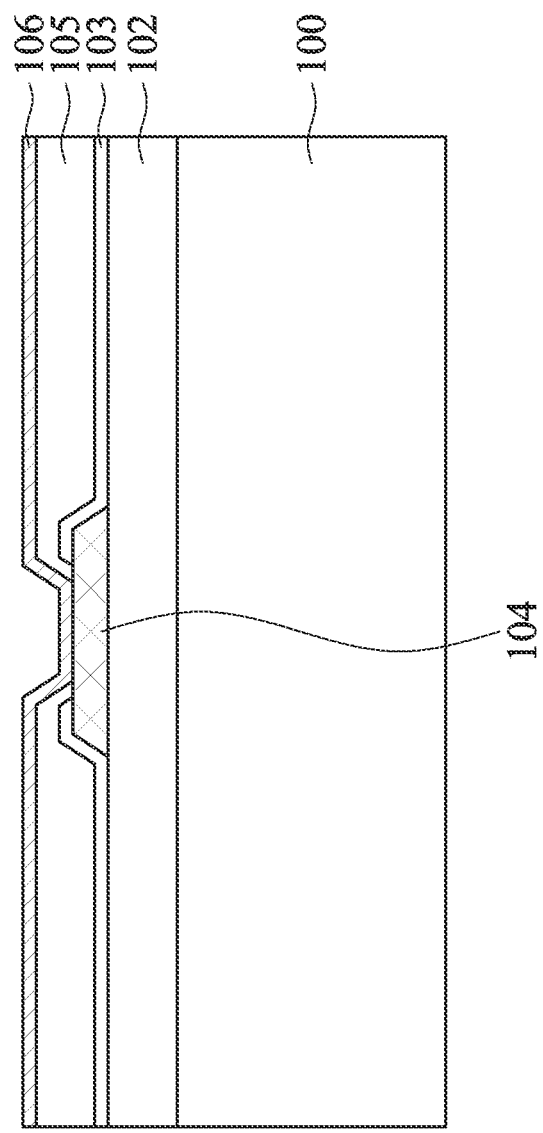

As shown in FIG. 1B, an under-bump metallization (UBM) layer 106 is deposited over the protection layer 105 and the conductive feature 104, in accordance with some embodiments. In some embodiments, the UBM layer 106 is a single layer or a stack of multiple layers. For example, the UBM layer 106 may be made of Ti, TiW, TiCu, Ni, other suitable materials, or a combination thereof. In some embodiments, the UBM layer 106 includes sub-layers including, for example, a diffusion barrier layer (or a glue layer) and a seed layer.

In some embodiments, the diffusion barrier layer is made of titanium (Ti), tantalum (Ta), titanium nitride (TiN), tantalum nitride (TaN), other suitable materials, or a combination thereof. In some embodiments, the seed layer is a copper seed layer formed on the diffusion barrier layer. The copper seed layer may be made of copper or one of many copper alloys that include silver, chromium, nickel, tin, gold, or a combination thereof. In some embodiments, the UBM layer 106 is deposited by using a physical vapor deposition (PVD) process (including, for example, a sputtering process or an evaporation process), a chemical vapor deposition (CVD) process, an electroplating process, a spin-on process, another applicable process, or a combination thereof.

Figure 1C:
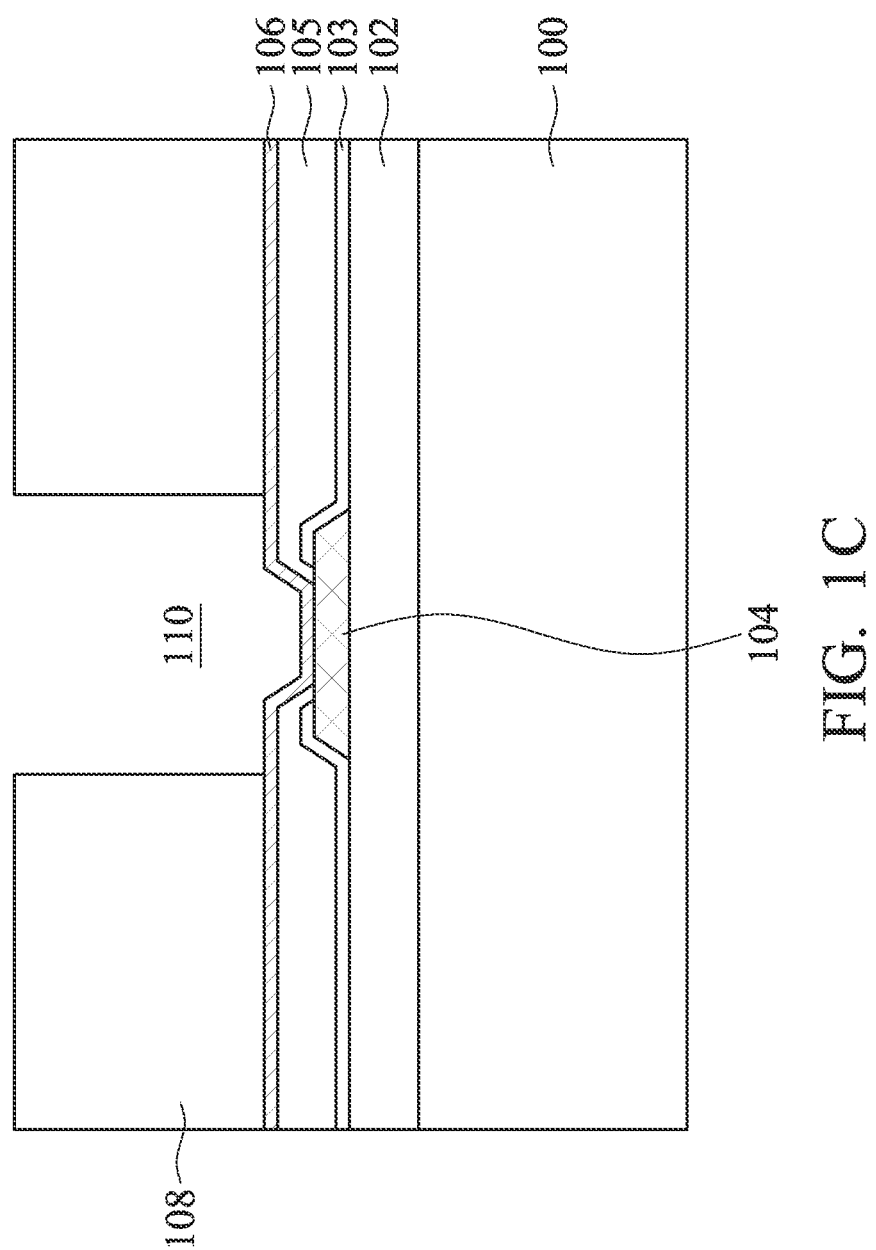

As shown in FIG. 1C, a mask layer 108 is formed over the UBM layer 106, in accordance with some embodiments. The mask layer 108 is used for defining the bump window. The mask layer 108 has one or more openings including an opening 110. In some embodiments, the opening 110 exposes a portion of the UBM layer 106 above the conductive feature 104. In some embodiments, the opening 110 is wider than the conductive feature 104. In some embodiments, the mask layer 108 is a photoresist layer, a dry film, other suitable films, or a combination thereof. In some embodiments, the mask layer 108 is deposited using a spin-on process, a spraying process, a CVD process, an attachment process, other applicable processes, or a combination thereof. In some embodiments, the mask layer 108 is patterned by using a lithography process involving one or more masking, exposing, baking, developing, and rinsing processes (not necessarily in that order).

Figure 1D:
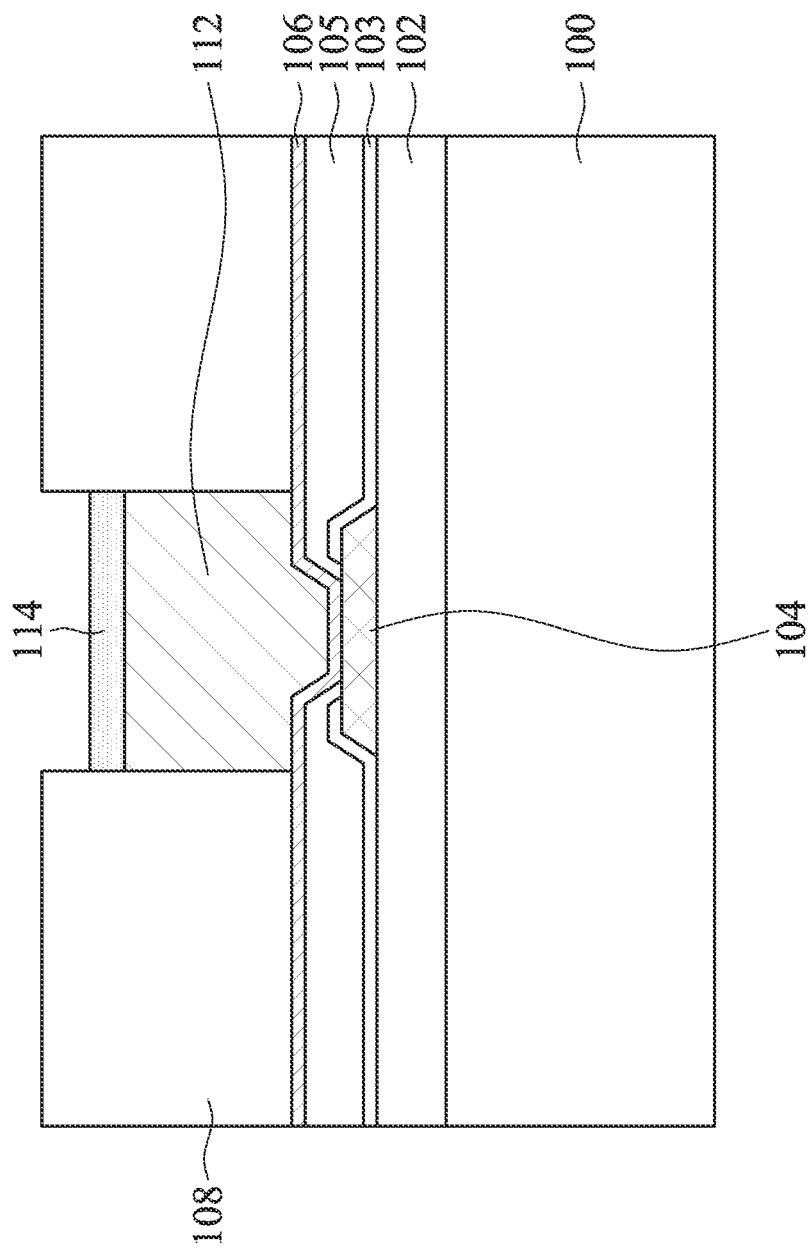

As shown in FIG. 1D, a conductive pillar 112 is deposited over the UBM layer 106 exposed by the opening 110 of the mask layer 108, in accordance with some embodiments. In some embodiments, the conductive pillar 112 is made of copper (Cu), gold (Au), platinum (Pt), titanium (Ti), nickel (Ni), aluminum (Al), other suitable materials, or a combination thereof. In some embodiments, the conductive pillar 112 includes pure elemental copper, copper containing some impurities, or copper alloys containing minor amounts of elements. For example, the copper alloys may contain tantalum, indium, tin, zinc, manganese, chromium, titanium, germanium, strontium, platinum, magnesium, aluminum, zirconium, other suitable elements, or a combination thereof.

In some embodiments, the conductive pillar 112 is formed using an electroplating process, a PVD process, a CVD process, an electroless plating process, other applicable processes, or a combination thereof. In some embodiments, the UBM layer 106 is also used as an electroplating seed layer. A suitable conductive material, such as copper, is electroplated on the UBM layer 106 to form the conductive pillar 112.

As shown in FIG. 1D, a solder layer 114 is formed over the conductive pillar 112, in accordance with some embodiments. The solder layer 114 includes tin (Sn) and may contain lead or may be lead free. In some embodiments, the solder layer 114 includes tin (Sn) and other materials including lead (Pb), silver (Ag), bismuth (Bi), copper (Cu), gold (Ag), aluminum (Al), arsenic (As), iron (Fe), nickel (Ni), antimony (Sb), other suitable materials, or a combination thereof. In some embodiments, the solder layer 114 is formed using an electroplating process or other applicable processes.

Embodiments of the disclosure have many variations. In some embodiments, a barrier layer (not shown) is formed over the conductive pillar 112 before the solder layer 114 is formed. The barrier layer may be used to prevent ions (such as copper ions) in the conductive pillar 112 from diffusing into the solder layer 114. The prevention of ion diffusion (such as copper diffusion) may increase the reliability and bonding strength. In some embodiments, the barrier layer is made of nickel (Ni), gold (Au), tin-lead (SnPb), silver (Ag), palladium (Pd), indium (In), nickel-palladium-gold (NiPdAu), nickel-gold (NiAu), other suitable material, or a combination thereof. In some embodiments, the barrier layer is formed using an electroplating process, an electroless plating process, a PVD process, a CVD process, a spin-on process, other applicable processes, or a combination thereof.

Figure 1E:
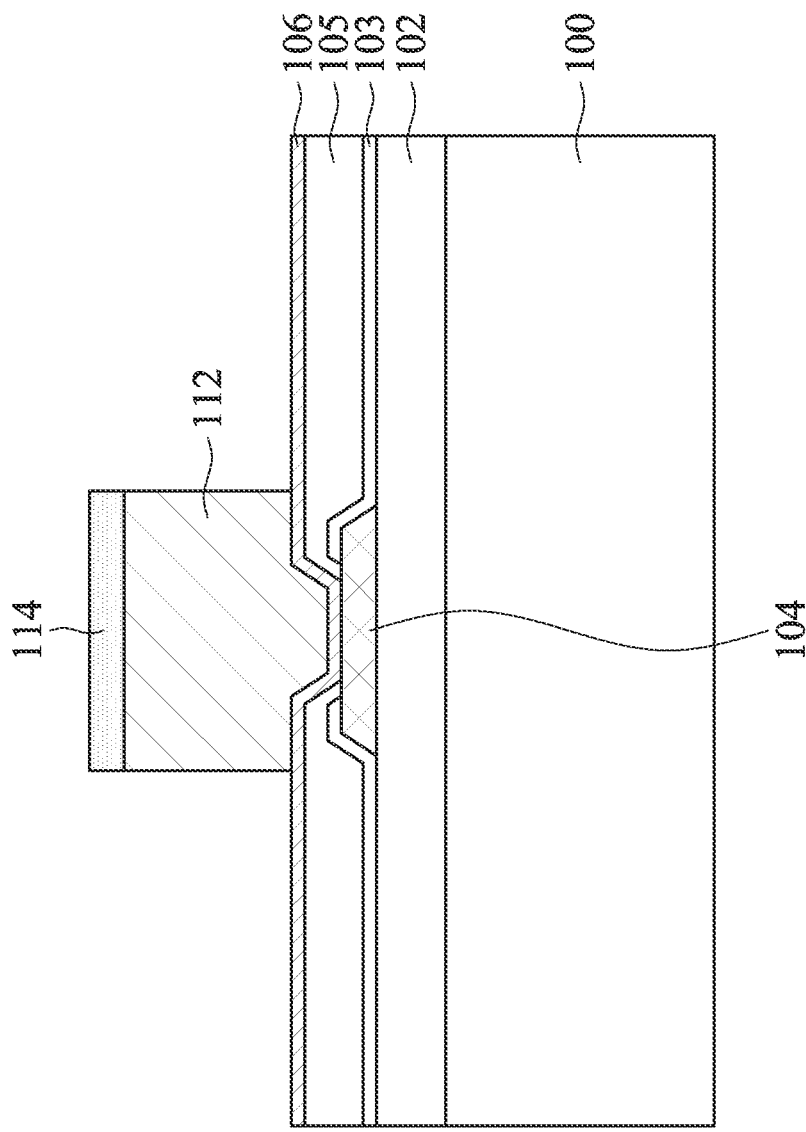

Afterwards, the mask layer 108 is removed, as shown in FIG. 1E in accordance with some embodiments. In some embodiments, the mask layer 108 is removed using a stripping process, an ashing process, other applicable processes, or a combination thereof.

Figure 1F:
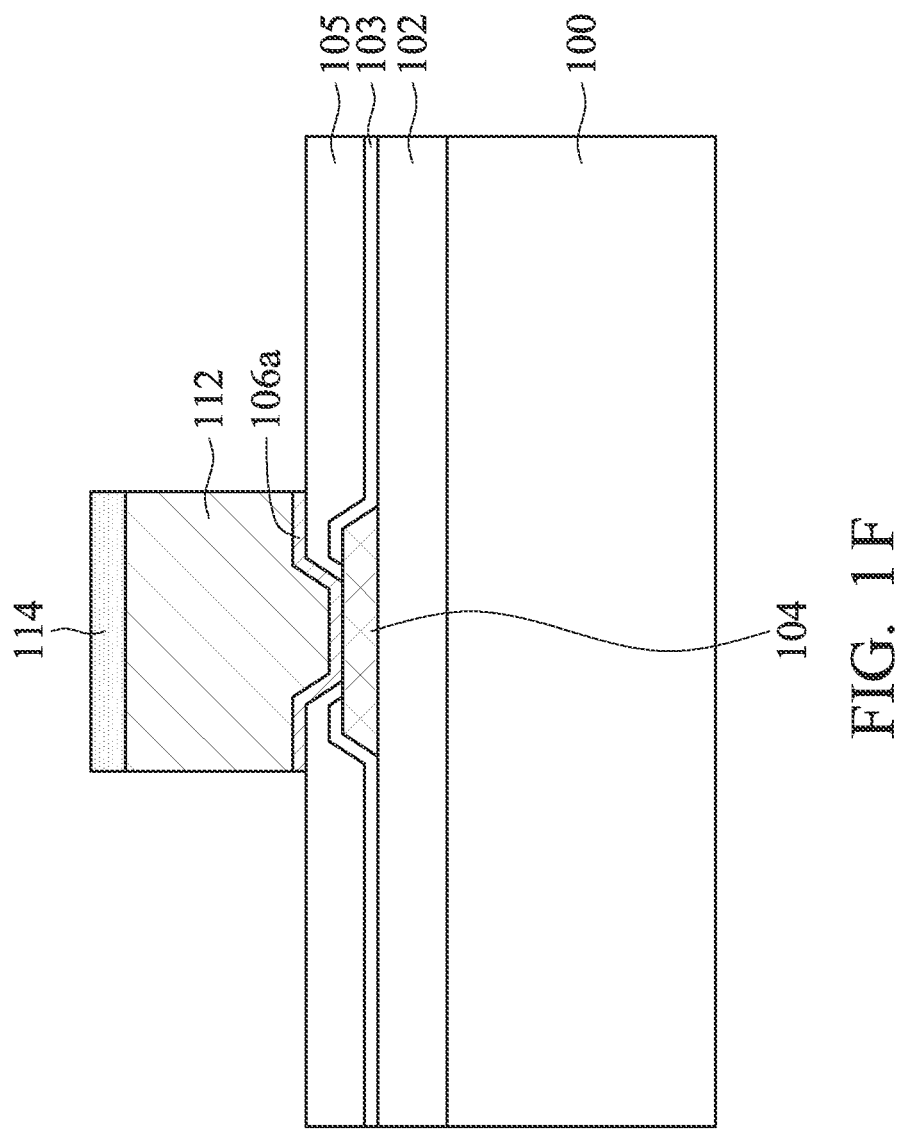

As shown in FIG. 1F, the UBM layer 106 is then patterned to form one or more UBM elements over the semiconductor substrate 100, in accordance with some embodiments. In some embodiments, a UBM element 106a is formed over the conductive feature 104, as shown in FIG. 1F. In some embodiments, the UBM layer 106 is patterned using an etching process. The etching process may include a dry etching process, a wet etching process, or a combination thereof. For example, the solder layer 114 and the conductive pillar 112 are together used as an etching mask. After the etching process, the UBM layer 106 not covered by the etching mask is removed to expose the protection layer 105. As a result, one or more UBM elements, including the UBM element 106a, are formed.

Figure 1G:
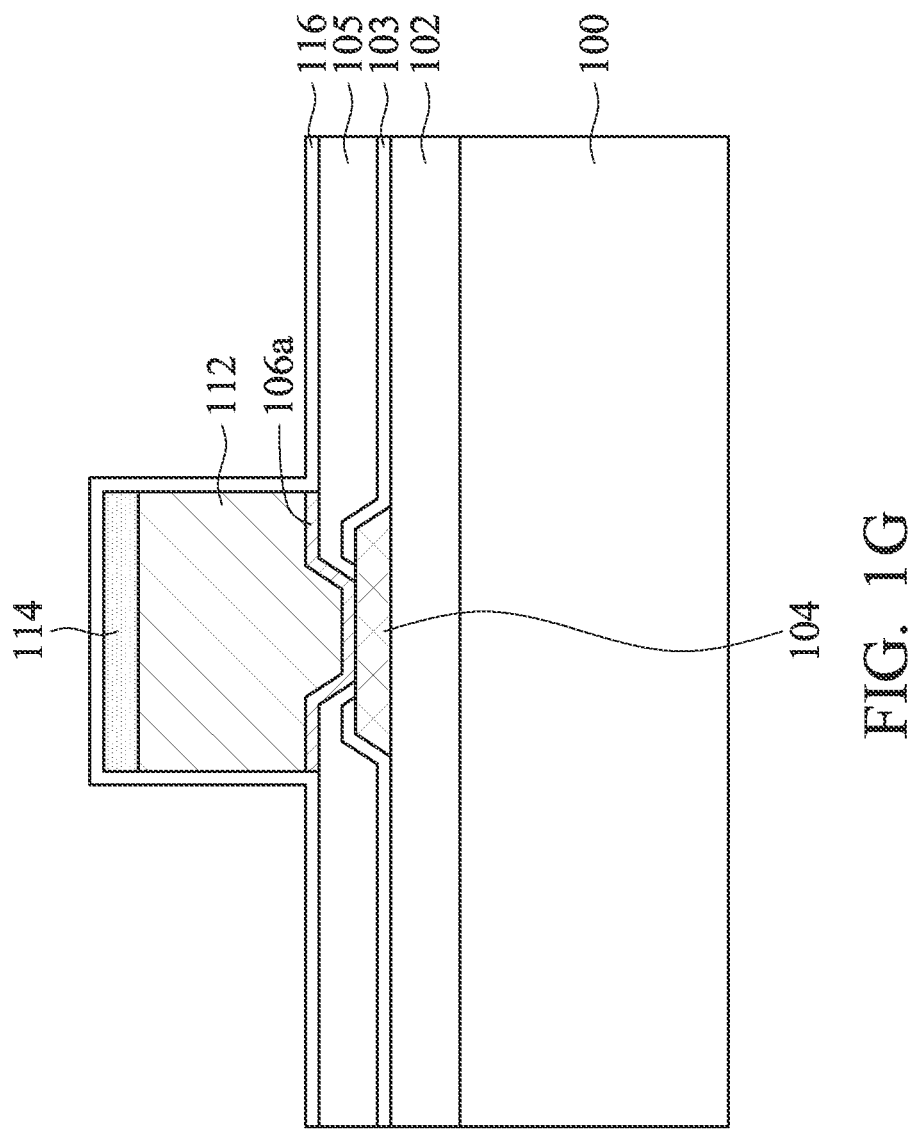

As shown in FIG. 1G, a flux 116 is formed over the solder layer 114, in accordance with some embodiments. In some embodiments, the flux 116 is also formed over the protection layer 105. In some embodiments, the flux 116 is also formed over sidewalls of the conductive pillar 112. In some embodiments, the flux 116 is a water-soluble flux. The water-soluble flux may include suitable saponifiers, suitable rosin, diethylene glycol butyl ether, suitable surfactant, suitable organic acid, glycol, ethoxylated tallow alkyl amines, suitable organic salt, suitable mineral salt, other suitable materials, or a combination thereof. In some embodiments, the flux 116 is formed using a spin-on process, a spraying process, an application process, a CVD process, other applicable processes, or a combination thereof. In some embodiments, the flux 116 has a thickness ranging from about 5 μm to about 50 μm. In some other embodiments, the flux 116 has a thickness ranging from about 10 μm to about 30 μm. In some other embodiments, the flux 116 has a thickness smaller than about 5 μm.

Figure 1H:
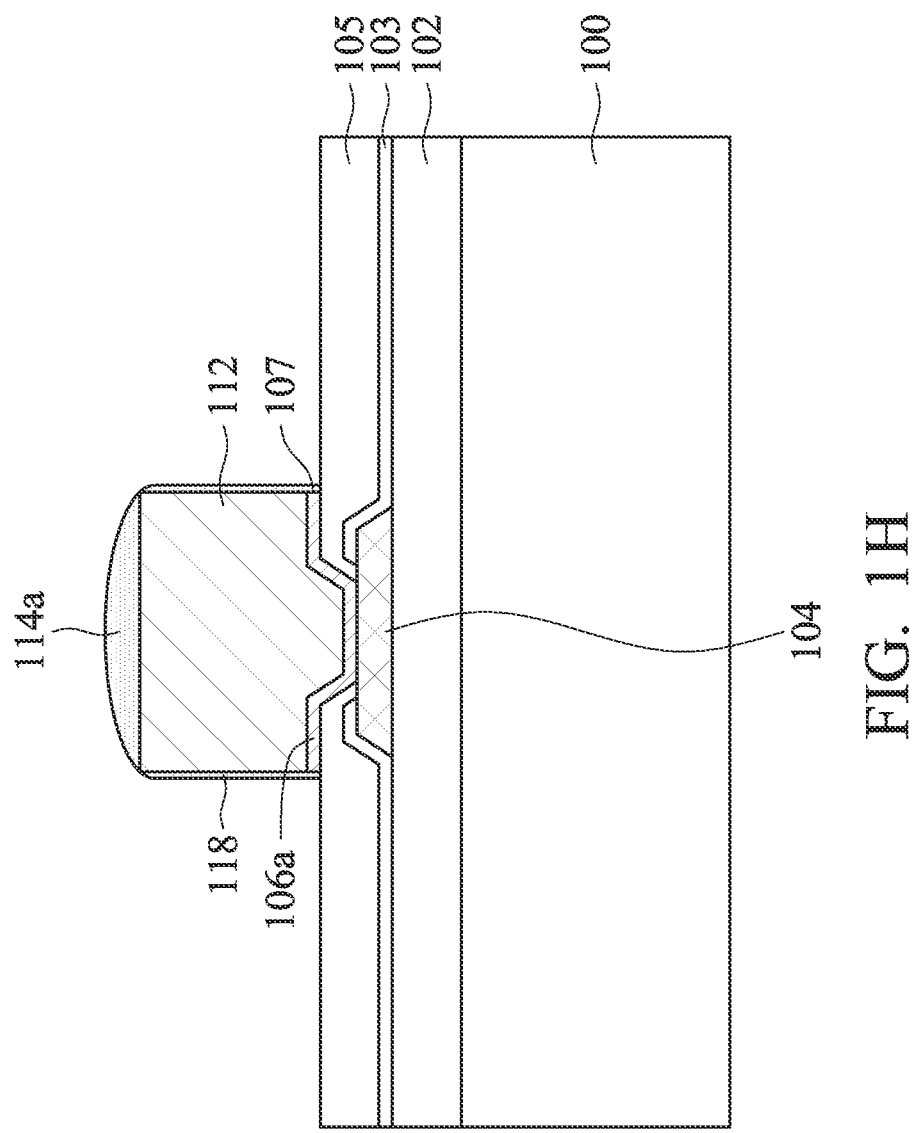

As shown in FIG. 1H, the solder layer 114 is reflowed to form a solder bump 114a over the conductive pillar 112, in accordance with some embodiments. In some embodiments, the solder layer 114 is reflowed at a reflow temperature ranging from about 200 degrees C. to about 280 degrees C. In some other embodiments, the reflow temperature is in a range from about 220 degrees C. to about 260 degrees C. In some embodiments, a cleaning operation is performed to remove the flux residue after the reflow process for forming the solder bump 114a. In some embodiments, due to the water-soluble characteristics of the flux 116, the cleaning operation is easier to perform.

As shown in FIG. 1H, a sidewall protection layer 118 is formed over the sidewalls of the conductive pillar 112, in accordance with some embodiments. In some embodiments, the sidewalls of the conductive pillar 112 are completely covered by, for example, the sidewall protection layer 118. In some embodiments, the sidewall protection layer 118 is conformally formed on the sidewalls of the conductive pillar 112. The sidewall protection layer 118 covers a side surface 107 of the UBM element 106a, as shown in FIG. 1H in accordance with some embodiments. In some embodiments, the sidewall protection layer 118 is in direct contact with the side surface 107 of the UBM element 106a. In some embodiments, the sidewall protection layer 118 is formed over the sidewalls of the conductive pillar 112 during the reflow process. In some embodiments, the sidewall protection layer 118 is in direct contact with the protection layer 105. In some embodiments, the sidewall protection layer 118 is not in direct contact with the conductive feature 104.

Studies show that the sidewall protection layer 118 is formed if the flux 116 used is water-soluble. The mechanisms of the formation of the sidewall protection layer 118 are not clear. It might be possible that the water-soluble flux 116 would induce the material of the solder layer 114 to extend over the sidewall of the conductive pillar 112. For example, a portion of the solder layer 114 may be dissolved and/or dispersed in the water-soluble flux 116 and be led onto the sidewall of the conductive pillar 112. As a result, the sidewall of the conductive pillar 112 is coated with the sidewall protection layer 118. In some embodiments, the sidewall protection layer 118 and the solder bump 114a are formed simultaneously. In some embodiments, the sidewall protection layer 118 is formed before the solder bump 114a is completely formed. In some other embodiments, the sidewall protection layer 118 is formed after the solder bump 114a is completely formed.

In some embodiments, the sidewall protection layer 118 includes tin (Sn). In some embodiments, a portion of the solder layer 114 is extended over the sidewalls of the conductive pillar 112 to form the sidewall protection layer 118 due to the effect of the flux 116 which is water-soluble. In some embodiments, the sidewall protection layer 118 includes a tin alloy containing copper (SnCu). The SnCu alloy may be formed due to the reaction between tin coming from the solder layer 114 and copper coming from the conductive pillar 112. In some embodiments, the materials of the sidewall protection layer 118 and the solder bump 114a are substantially the same.

In some embodiments, the solder bump 114a includes tin (Sn) and an element other than tin. For example, the solder bump 114a further includes silver (Ag), bismuth (Bi), gold (Ag), aluminum (Al), arsenic (As), iron (Fe), nickel (Ni), lead (Pb), or antimony (Sb). In some embodiments, the sidewall protection layer 118 also includes the element other than tin. In some embodiments, the sidewall protection layer 118 includes tin and a second element. The second element includes, for example, silver (Ag), bismuth (Bi), gold (Ag), aluminum (Al), arsenic (As), iron (Fe), nickel (Ni), lead (Pb), or antimony (Sb). In some embodiments, the sidewall protection layer 118 includes tin, copper, and a third element. The third element includes, for example, silver (Ag), bismuth (Bi), gold (Ag), aluminum (Al), arsenic (As), iron (Fe), nickel (Ni), lead (Pb), or antimony (Sb).

Embodiments of the disclosure have many variations. In some embodiments, the sidewall protection layer 118 is not formed during the solder layer 114 is reflowed. In some embodiments, the flux 116 and the solder layer 114 are together heated at a temperature lower than the reflow temperature of the solder layer 114. The temperature may be in a range from about 150 degrees C. to about 190 degrees C. In some other embodiments, the temperature is in a range from about 120 degrees C. to about 180 degrees C. The sidewall protection layer 118 is formed over the sidewalls of the conductive pillar 112 even if the solder layer 114 is not reflowed to form the solder bump 114a. The mechanisms of the formation of the sidewall protection layer 118 are not clear. It might be possible that a portion of the solder layer 114 may be dissolved and/or dispersed in the water-soluble flux 116 and be led onto the sidewall of the conductive pillar 112 even if the heating temperature is not as high as the reflow temperature. In some embodiments, the heating temperature is further increased to be substantially equal to or higher than the reflow temperature to form the solder bump 114a. In these cases, the sidewall protection layer 118 is formed before the solder bump 114a is formed.

In some embodiments, the conductive pillar 112 is made of copper or another material which has a tendency to be oxidized during the manufacturing process. Oxidized copper pillars may lead to poor adhesion of an electronic component to a substrate. The poor adhesion may cause reliability concerns due to leakage current. Oxidized copper pillars may also lead to underfill cracking along the interface between the underfill and the copper pillars. The cracks may propagate to the underlying low-k dielectric layers or to the solder used to bond the copper pillars to the substrate. Although the concerns mentioned above do not always occur, it is desirable to reduce or avoid the oxidation of the conductive pillar.

In some embodiments of the disclosure, due to the existence of the sidewall protection layer 118, the conductive pillar 112 is protected. The oxidation of the conductive pillar 112 is prevented or significantly reduced. The quality and the reliability of the conductive pillar 112 are improved. The sidewall protection layer 118 is formed by using the reflow process for forming the solder bump 114a. In some embodiments, no additional process is needed or used to form the sidewall protection layer 118. Fabrication cost and fabrication time are greatly reduced. The flux 116 is a water-soluble flux which could be removed easily during the cleaning operation. Fabrication cost and fabrication time are therefore further reduced.

Embodiments of the disclosure have many variations. As mentioned above, the passivation layer 103 and the protection layer 105 are optional in some embodiments. FIGS. 2A-2E are cross-sectional views of various stages of a process for forming a semiconductor device structure, in accordance with some embodiments. In the embodiments illustrated in FIGS. 2A-2E, the passivation layer 103 and the protection layer 105 are not formed.

Figure 2A:
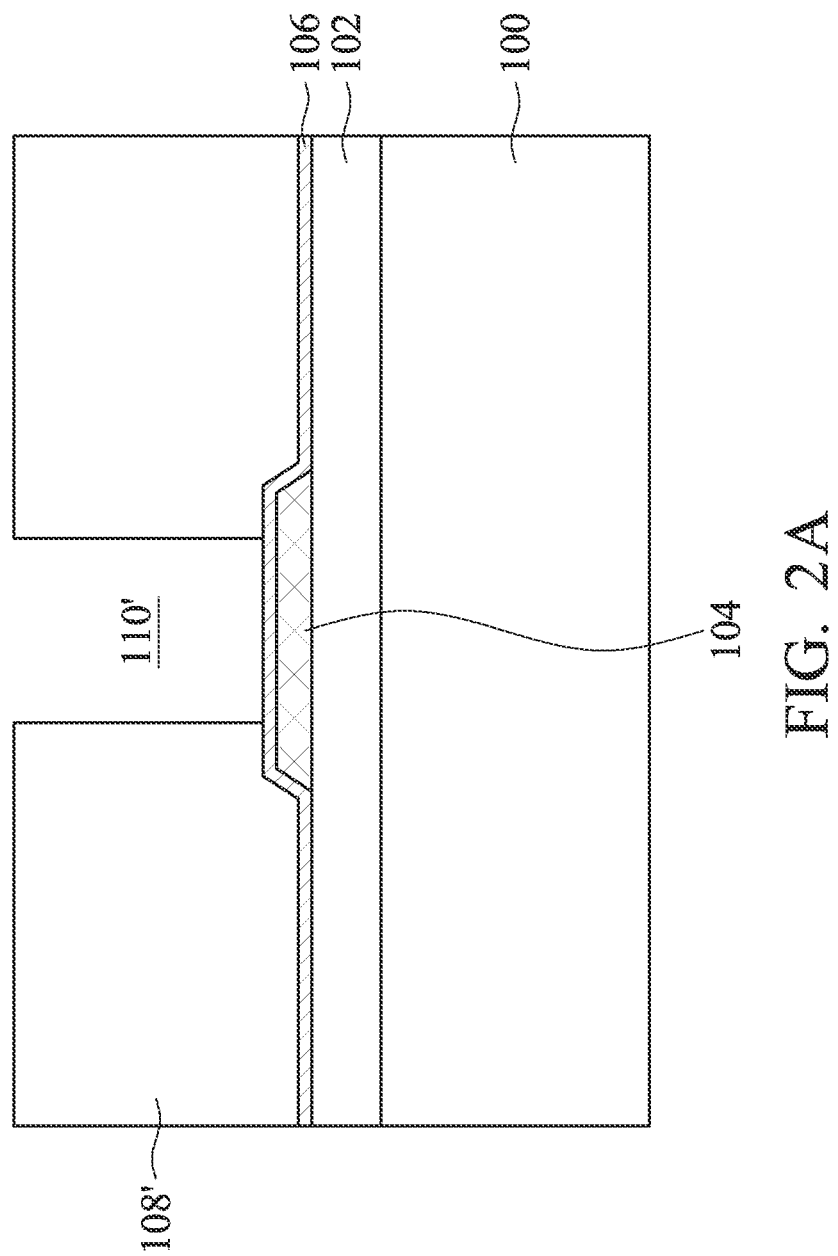
FIGS. 2A-2E are cross-sectional views of various stages of a process for forming a semiconductor device structure, in accordance with some embodiments.

As shown in FIG. 2A, a structure similar to that shown in FIG. 1A is provided. As shown in FIG. 2A, the passivation layer 103 and the protection layer 105 are not formed. As shown in FIG. 2A, the UBM layer 106 is formed over the dielectric layer 102 and the conductive feature 104, in accordance with some embodiments. The materials and formation methods of the UBM layer 106 are similar to those of the UBM layer 106 shown in FIG. 1B. Afterwards, a mask layer 108' having an opening 110' is formed over the UBM layer 106, as shown in FIG. 2A in accordance with some embodiments. The conductive feature 104 is wider than the opening 110', as shown in FIG. 2A. In some embodiments, the materials and formation methods of the mask layer 108' are similar to those of the mask layer 108 shown in FIG. 10.

Figure 2B:
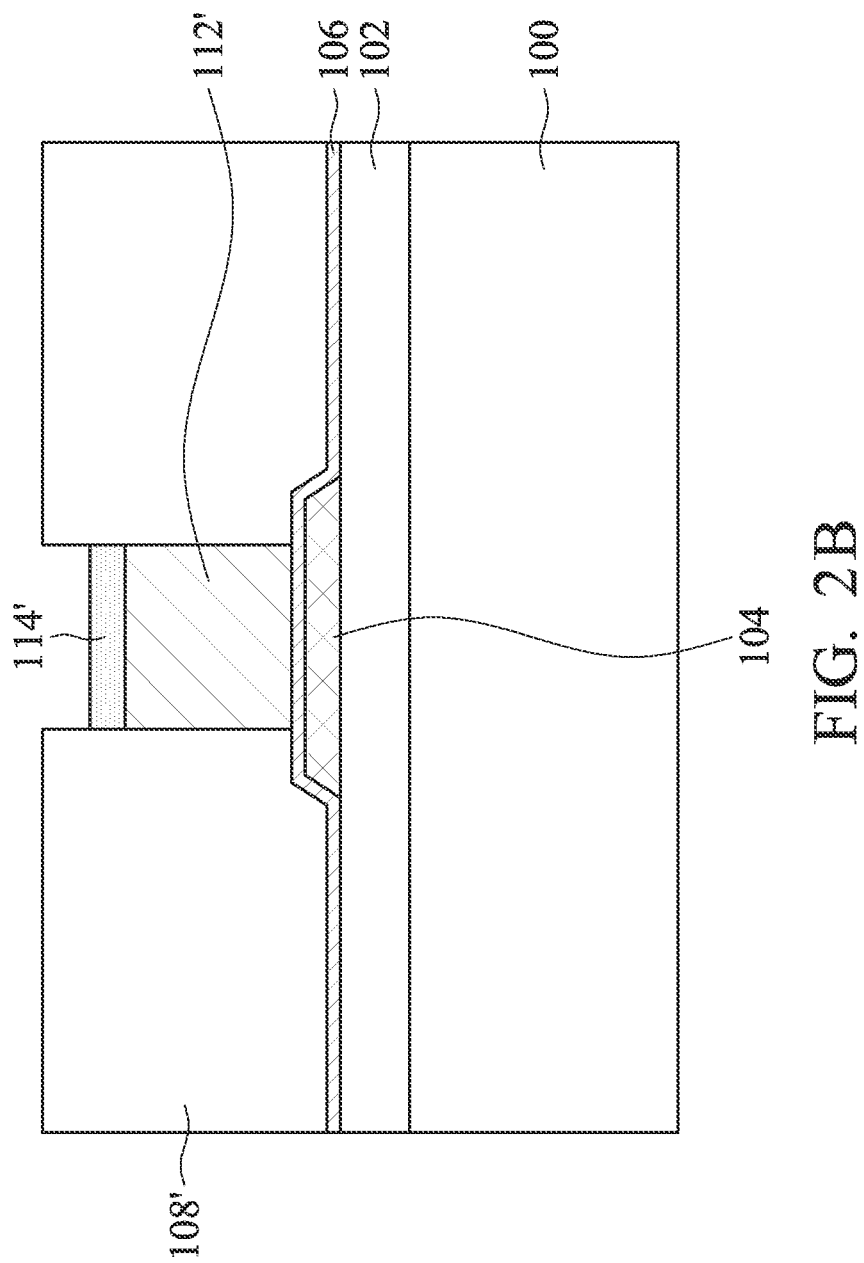

As shown in FIG. 2B, a conductive pillar 112' is formed over the UBM layer 106 exposed by the opening 110' of the mask layer 108', in accordance with some embodiments. In some embodiments, the materials and formation methods of the conductive pillar 112' are similar to those of the conductive pillar 112 shown in FIG. 1D. The conductive feature 104 is wider than the conductive pillar 112', as shown in FIG. 2B. Afterwards, a solder layer 114' is deposited over the conductive pillar 112', as shown in FIG. 2B in accordance with some embodiments. In some embodiments, the materials and the formation methods of the solder layer 114' are similar to those of the solder layer 114 shown in FIG. 1D. A barrier layer (not shown) may be formed between the solder layer 114' and the conductive pillar 112'.

Figure 2C:
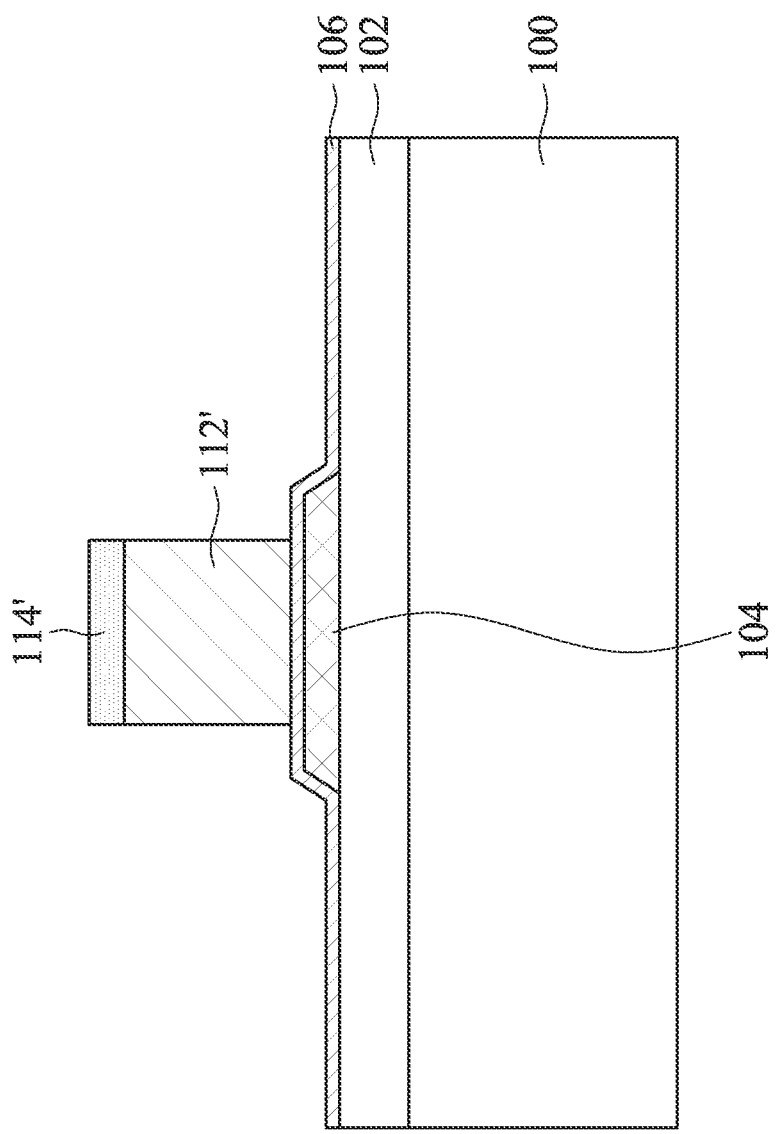
Figure 2D:
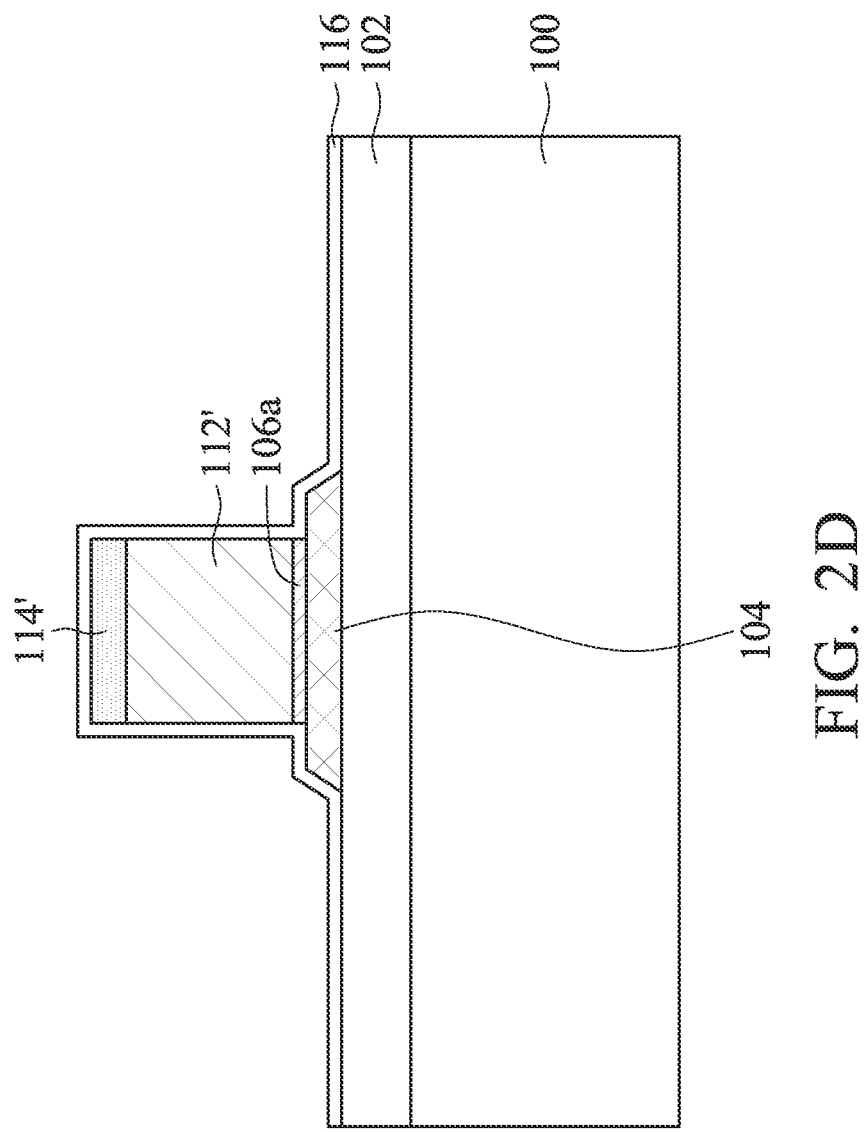

As shown in FIG. 2C, the mask layer 108' is removed, in accordance with some embodiments. Afterwards, the UBM layer 106 is patterned to form one or more UBM elements including the UBM element 106a, as shown in FIG. 2D in accordance with some embodiments. As shown in FIG. 2D, the flux 116 is formed over the solder layer 114', in accordance with some embodiments. In some embodiments, the flux 116 is also formed over the sidewalls of the conductive pillar 112', the conductive feature 104, and the dielectric layer 102. The materials and the formation methods of the flux 116 may be similar to those of the flux 116 illustrated in FIG. 1G.

Figure 2E:
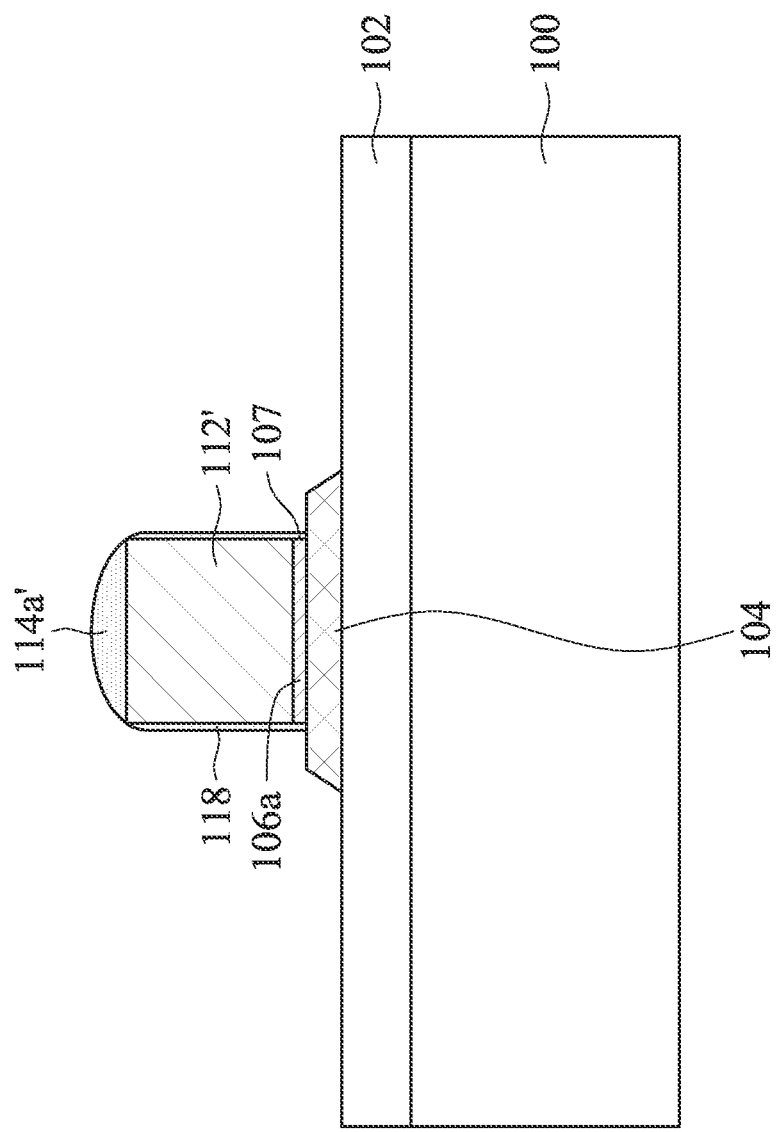

As shown in FIG. 2E, the solder layer 114' is reflowed to form a solder bump 114a', in accordance with some embodiments. In some embodiments, the reflow process for forming the solder bump 114a' is similar to that for forming the solder bump 114a as shown in FIG. 1H. A cleaning operation may be optionally performed to remove the flux residue after the reflow process.

As shown in FIG. 2E, the sidewall protection layer 118 is formed over the sidewalls of the conductive pillar 112', in accordance with some embodiments. In some embodiments, the sidewall protection layer 118 is in direct contact with the conductive feature 104. In some embodiments, the sidewall protection layer 118 covers the side surface 107 of the UBM element 106a. In some embodiments, the sidewall protection layer 118 is in direct contact with the side surface 107 of the UBM element 106a. In some embodiments, the materials and the formation methods of the sidewall protection layer 118 are similar to those of the sidewall protection layer 118 shown in FIG. 1H. Therefore, the conductive pillar 112' may be protected from being oxidized. The quality and the reliability of the conductive pillar 112' are improved.

Figure 3:
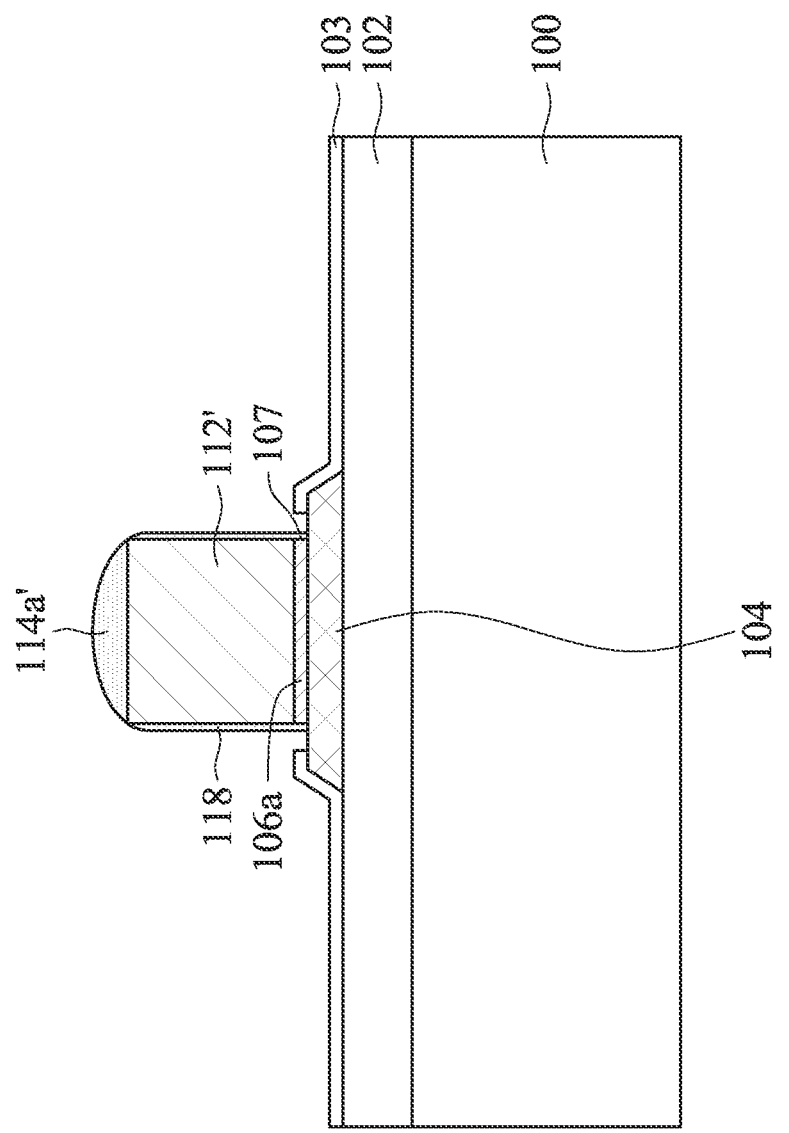
FIG. 3 is a cross-sectional view of a semiconductor device structure, in accordance with some embodiments.

Embodiments of the disclosure have many variations. FIG. 3 is a cross-sectional view of a semiconductor device structure, in accordance with some embodiments. In some embodiments, the sidewall protection layer 118 is in direct contact with the conductive feature 104. In some embodiments, the sidewall protection layer 118 covers the side surface 107 of the UBM element 106a. In some embodiments, the sidewall protection layer 118 is in direct contact with the side surface 107 of the UBM element 106a. The embodiments shown in FIG. 3 are similar to those shown in FIG. 2E. As shown in FIG. 3, the passivation layer 103 is formed, and the protection layer 105 is not formed. The materials and the formation methods of the passivation layer 103 are similar to those of the passivation layer 103 shown in FIG. 1A. As shown in FIG. 3, the sidewall protection layer 118 protects the conductive pillar 112' from being oxidized during the manufacturing processes.

In some embodiments, the structures shown in FIGS. 1H, 2E, and 3 are bonded onto a substrate to form a package structure (not shown). A suitable process, such as a reflow process, a thermal compression process, or the like, is performed to form a bonding structure therebetween. For example, the solder bump may be bonded onto a pad or a trace formed over the substrate. In some embodiments, a protection material is formed between the semiconductor substrate and the substrate to surround the bonding structure. In some embodiments, the protection material includes a resin material such as an epoxy resin, a phenol resin, other suitable material, or a combination thereof. In some embodiments, the protection material includes an underfill material, a non-conductive paste (NCP), other suitable insulating materials, or a combination thereof. In some embodiments, the protection material is dispensed, flowed, and/or applied to surround the bonding structure of the package structure.

Embodiments of the disclosure use a water-soluble flux to assist in a reflow process for forming a solder bump over a conductive pillar. Due to the effect of the water-soluble flux, a sidewall protection layer is formed over sidewalls of the conductive pillar. The sidewall protection layer protects the conductive pillar from being oxidized. The quality and reliability of the conductive pillar are greatly improved. The sidewall protection layer is formed together with the reflow process. No expensive process (such as an electroplating and/or immersion process) is used to form the sidewall protection layer. Fabrication cost and fabrication time are also significantly reduced.

In accordance with some embodiments, a method for forming a semiconductor device structure is provided. The method includes forming a conductive pillar over a semiconductor substrate. The method also includes forming a solder layer over the conductive pillar. The method further includes forming a water-soluble flux over the solder layer. In addition, the method includes reflowing the solder layer to form a solder bump over the conductive pillar and form a sidewall protection layer over a sidewall of the conductive pillar during the solder layer is reflowed.

In accordance with some embodiments, a method for forming a semiconductor device structure is provided. The method includes forming a conductive pillar over a semiconductor substrate. The method also includes forming a solder layer over the conductive pillar. The method further includes forming a water-soluble flux over the solder layer. In addition, the method includes heating the water-soluble flux and the solder layer to form a sidewall protection layer over a sidewall of the conductive pillar.

In accordance with some embodiments, a semiconductor device structure is provided. The semiconductor device structure includes a semiconductor substrate and a conductive pillar over the semiconductor substrate. The semiconductor device structure also includes a solder bump over the conductive pillar. The semiconductor device structure further includes a sidewall protection layer over a sidewall of the conductive pillar. Both the sidewall protection layer and the solder bump comprise tin (Sn) and a second element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a conductive pillar over a semiconductor substrate;
    forming a solder layer over the conductive pillar;
    forming a water-soluble flux over the solder layer;
    heating the water-soluble flux and the solder layer at a temperature lower than a reflow temperature of the solder layer until a sidewall protection layer is formed from the solder layer, the sidewall protection layer extending over a sidewall of the conductive pillar; and
    reflowing the solder layer to form a solder bump over the conductive pillar.

2. The method for forming a semiconductor device structure as claimed in claim 1, further comprising forming an under-bump metallization (UBM) element over the semiconductor substrate, wherein the conductive pillar is formed on the under-bump metallization element.

3. The method for forming a semiconductor device structure as claimed in claim 2, further comprising:
    forming an under-bump metallization (UBM) layer over the semiconductor substrate;

forming a mask layer over the UBM layer, wherein the mask layer has an opening exposing the UBM layer;

forming the conductive pillar in the opening;

removing the mask layer; and removing a portion of the UBM layer to form the UBM element.

4. The method for forming a semiconductor device structure as claimed in claim 3, wherein the solder layer is formed in the opening of the mask layer.

5. The method for forming a semiconductor device structure as claimed in claim 3, wherein the conductive pillar is formed using an electroplating process.

6. The method for forming a semiconductor device structure as claimed in claim 3, wherein the solder layer is formed using an electroplating process.

7. The method for forming a semiconductor device structure as claimed in claim 3, wherein the water-soluble flux is formed after the UBM element is formed.

8. The method for forming a semiconductor device structure as claimed in claim 3, further comprising removing the water-soluble flux after the solder bump is formed.

9. The method for forming a semiconductor device structure as claimed in claim 3, wherein the sidewall protection layer is formed after the mask layer is removed.

10. The method for forming a semiconductor device structure as claimed in claim 1, wherein a portion of the solder layer is extended over the sidewall of the conductive pillar to form the sidewall protection layer.

11. The method for forming a semiconductor device structure as claimed in claim 1, wherein the solder layer is formed directly on the conductive pillar.

12. A method for forming a semiconductor device structure, comprising:

forming a conductive pillar over a semiconductor substrate;

forming a solder layer over the conductive pillar;

forming a water-soluble flux over the solder layer; and heating the water-soluble flux and the solder layer to form a sidewall protection layer from the solder layer, the sidewall protection layer extending over a sidewall of the conductive pillar, wherein the water-soluble flux and the solder layer are heated at a temperature lower than a reflow temperature of the solder layer.

13. The method for forming a semiconductor device structure as claimed in claim 12, further comprising:

forming an under-bump metallization (UBM) layer over the semiconductor substrate;

forming a mask layer over the UBM layer, wherein the mask layer has an opening exposing the UBM layer;

forming the conductive pillar in the opening;

removing the mask layer; and removing a portion of the UBM layer to form an under-bump metallization (UBM) element.

14. The method for forming a semiconductor device structure as claimed in claim 13, wherein the conductive pillar is formed by electroplating copper over the UBM layer exposed by the opening of the mask layer.

15. The method for forming a semiconductor device structure as claimed in claim 12, wherein a portion of the solder layer is extended over the sidewall of the conductive pillar to form the sidewall protection layer.

16. The method for forming a semiconductor device structure as claimed in claim 12, wherein the conductive pillar is formed to have a substantially planar top surface.

17. A method for forming a semiconductor device structure, comprising:

forming a conductive pillar over a semiconductor substrate;

forming a solder layer over the conductive pillar;

forming a water-soluble flux over the solder layer;

heating the water-soluble flux and the solder layer at a temperature lower than a reflow temperature of the solder layer until a sidewall protection layer is formed over a sidewall of the conductive pillar, wherein the sidewall protection layer comprises tin (Sn) from the solder layer; and reflowing the solder layer to form a solder bump over the conductive pillar after forming the water-soluble flux.

18. The method as claimed in claim 17, further comprising forming an under-bump metallization (UBM) element over the semiconductor substrate, wherein the conductive pillar is formed on the UBM element.

19. The method as claimed in claim 18, wherein the water-soluble flux is formed after the formation of the UBM element.

20. The method for forming a semiconductor device structure as claimed in claim 17, wherein the conductive pillar is thicker than the solder layer, and the sidewall protection layer is formed to be in direct contact with the conductive pillar.

* * * * *